(12) United States Patent
Chen et al.

(10) Patent No.: US 6,900,678 B2
(45) Date of Patent: May 31, 2005

(54) DELAY LOCK CIRCUIT USING BISECTION ALGORITHM AND RELATED METHOD

(75) Inventors: Jui-Lung Chen, Hsin-Chu (TW); Shih-Huang Huang, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 417 days.

(21) Appl. No.: 09/682,303

(22) Filed: Aug. 16, 2001

(65) Prior Publication Data

US 2003/0034814 A1 Feb. 20, 2003

(51) Int. Cl.[7] .................................................. H03L 7/06
(52) U.S. Cl. ........................ 327/158; 327/159; 327/277
(58) Field of Search .............................. 327/263, 269, 327/270, 272, 277, 284, 147, 149, 150, 156, 158, 159; 377/54, 56, 76

(56) References Cited

U.S. PATENT DOCUMENTS

| | | | | |
|---|---|---|---|---|
| 5,687,202 A | * | 11/1997 | Eitrheim | 375/376 |
| 5,771,264 A | * | 6/1998 | Lane | 375/376 |
| 5,910,740 A | * | 6/1999 | Underwood | 327/149 |
| 6,100,736 A | * | 8/2000 | Wu et al. | 327/159 |
| 6,388,480 B1 | * | 5/2002 | Stubbs et al. | 327/156 |
| 6,456,129 B1 | * | 9/2002 | Tsukude | 327/156 |
| 6,483,359 B2 | * | 11/2002 | Lee | 327/158 |
| 6,489,823 B2 | * | 12/2002 | Iwamoto | 327/158 |

FOREIGN PATENT DOCUMENTS

JP     199813219 A     1/1998

* cited by examiner

Primary Examiner—Timothy P. Callahan
Assistant Examiner—An T. Luu
(74) Attorney, Agent, or Firm—Winston Hsu

(57) ABSTRACT

A method for performing a delay lock to generate a second clock according to a first clock and to synchronize the second clock with the first clock is provided. The method has correcting processes executed to increase or decrease, by a correction interval, a delay time between corresponding periods of the first clock and the second clock. The correction interval for a subsequent correcting process is substantially half the previous correction interval of the previous correcting process.

13 Claims, 6 Drawing Sheets

DELAY LOCK CIRCUIT USING BISECTION ALGORITHM AND RELATED METHOD

BACKGROUND OF INVENTION

1. Field of the Invention

The present invention relates to a delay lock circuit. More particularly, the present invention discloses a delay lock circuit using a bisection algorithm and its related method.

2. Description of the Prior Art

Today, people are familiar with the management, delivery, and exchange of digital information. Mobile phones, personal digital assistants (PDA), information applicants (IA), and digital devices of personal computers are used to conveniently manage and deliver digital information.

When delivering, exchanging, and managing digital information, the digital device must operate according to clocks so as to handle sequential digital signals. For example, the central processing unit (CPU) of the personal computer uses clocks for each built-in digital circuit to deal with the access and management of data. Mobile phones use clocks to trigger a beginning of receiving and transmitting digital information. If a mobile phone is used as a receiver to receive digital signals, the receiving end must synchronize local clocks with clocks of the received digital signals so as to receive and transmit digital information accurately.

In the process of managing digital information, the technique of generating another synchronized clock by a reference clock is widely used. In digital circuits, we can increase or decrease one frequency of two synchronized clocks to get two harmonic clocks with different frequencies so as to handle digital information among different digital circuits conveniently. Besides, we can use one clock to generate another synchronized clock containing much more current to drive the digital circuit with more logic gates. In digital mobile communication systems, when a mobile phone is used as a receiving end to generate a synchronized clock according to the received clock, the clock of received electronic wave is weak and contains little power. At the receiving end, it is necessary to generate a stronger synchronized clock to make the mobile phone operate normally.

The circuit that generates the synchronized clock according to a reference clock is generally known as a phase lock loop circuit. One embodiment of the phase lock loop circuit is the delay lock loop (DLL) circuit. Please refer to FIG. 1, which is a functional block diagram of a known delay lock loop circuit 10. The delay lock loop circuit 10 generates the synchronized second clock 14 according to the incoming first clock 12. The delay lock loop circuit 10 comprises a delayer 16, a buffer 20, a comparator 24, and a controller 22. The delayer 16 electronically connected to the buffer 20 has a plurality of delay units 18. The output of the buffer 20 feeds back to one side of the comparator 24, and the other side of the comparator 24 receives the input from the first clock 12. The output 25 of the comparator 25 is electronically connected to the controller 22, and the controller 22 controls the delayer 16.

The operation of the delay lock loop circuit 10 is illustrated as follows. When the first clock 12 is fed into the delayer 16, the delayer 16 delays the first clock 12 by certain periods of time to generate the second clock 14. The second clock 14 generated from the delayer 16 is fed into the buffer 20, and the buffer 20 equips the second clock 14 with higher current to be outputted. In order to synchronize the second clock 14 with the first clock 12, the delay lock loop circuit 10 has one feedback mechanism for correcting clocks. In such a mechanism, the first clock 12 and the second clock 14 are fed into the comparator 24 to check whether both frequencies are the same. The result of the comparison is fed into the controller 22. According to the result of the comparison, the controller 22 uses the delay units 18 to change the delay time of the second clock 14 so as to correct the delay time between the second clock 14 and the first clock 12. Among a plurality of delay units inside the delayer 16, each of the delay units can delay the second clock 14 by a fixed unit of time. The delayer 16 activates a different amount of the delay units to change the delay time of the second clock 14.

The method for synchronizing the second clock 14 with the first clock 12 is further illustrated by the flow chart of FIG. 2. Please refer to FIG. 2, which is a flow chart of a known delay lock loop circuit 10 that changes the delay time of the second clock 14 and synchronizes the second clock 14 with the first clock 12. The process contains the following steps.

Step 26: The delay lock process begins and starts adjusting the delay time of the second clock 14 to lock and synchronize with the first clock 12. In the beginning, the controller 22 controls the delayer 16 to generate a corresponding time period of the second clock 14 after delaying a fixed interval (initial value of the delay time) according to each clock trigger generated by the first clock 12. Because the delay lock loop circuit 10 has an unknown system delay, unknown delay time between the first clock 12 and the second clock 14, and the initial value of the delay time, the second clock, therefore, can not be synchronized with the first clock.

Step 28: After the second clock 14 is generated, the first clock 12 and the second clock 14 are fed into the comparator 24 to compare the periods of the two clocks. The comparator 24 determines a relative relation between the two clocks, that is, the lead/lag relation between the period of the first clock 12 and the corresponding period of the second clock 14. After comparing, the comparator 24 transmits a corresponding comparison signal to the controller 22, and the comparison signal determines whether one period of the first clock 12 leads the corresponding period of the second clock 14. In the present step, the comparator 24 is used to compare the lead/lag relation between the first clock 12 and the second clock 14. If the first clock 12 leads, go to Step 30; else, go to Step 32.

Step 30: After receiving the comparison signal from the comparator 24, the controller 22 decides how to adjust the delay time of the second clock 14. The controller 24 activates one delay unit 18 less when preceding Step 30. As shown above, each delay unit 18 can delay the second clock 14 by a unit of time (dt). The unit of delay time, for example, could be 1 nanosecond (ns). When activating one delay unit 18 less, the delay time of the second clock 14 decreases by one unit of delay time (dt). After adjusting the delay time of the second clock 14, the process jumps to Step 28 for comparing the first clock 12 and the second clock 14 again.

Step 32: Adjust the corresponding delay time of the second clock 14 according to the comparison result obtained from Step 28. In the present step, the controller 22 controls the delayer 16 to activate one delay unit 18 more, for increasing one unit of delay time of the second clock 14. After adjusting the delay time of the second clock 14, the process jumps to Step 28 for comparing the first clock 12 and the second clock 14 again.

The following example is used to illustrate the procedure mentioned above. Please refer to FIG. 3, which is a waveform plot of the first and second clocks when a prior art delay lock loop circuit is synchronizing the first clock with the second clock. In FIG. 3, the horizontal axis represents time, and the perpendicular axis represents a magnitude of the wave. Because the time needed for the whole process of the known phase lock loop circuit is long, the waveforms of the first and second clocks are divided into three parts.

Therefore, there are six waveforms in FIG. 3. The waveform 12a intersects waveform 12b at the point A1, and the waveform 14a intersects waveform 14b at the point A2. Similarly, the waveform 12b intersects waveform 12c at the point B1, and the waveform 14b intersects waveform 14c at the point B2. The waveforms 12a, 12b, and 12c intersect respectively at points A1 and B1 to form the whole waveform of the first clock 12 between time 0 and time 28T. Similarly, the waveforms 14a, 14b, and 14c are combined to represent the whole waveform of the second clock 14 between time 0 and time 28T. First, please refer to waveforms 12a and 14a in FIG. 3. The waveform 12a represents the waveform of the first clock 12 from time 0 to time 10T. The symbol T represents the interval of one period of the first clock 12 (as the interval 12p shown in the waveform 12a). In order to generate the synchronized second clock 14, the delay lock loop circuit 10 must keep the period of the first clock 12 fixed all the time. The delay lock loop circuit 10 adjusts the delay time of the second clock 14, so that the period of the corresponding waveform varies. The waveform 14a is the waveform of the second clock 14 between time 0 and time 10T.

When the delay lock loop circuit 10 starts operating, the delayer 16 generates the corresponding period of the second clock 14 after a certain delay time according to the trigger of the rising edge of the first clock 12. In the waveform 12a, the rising edge of the period 201a triggers the delayer 16 to generate the corresponding period 201b of the waveform 14a after a certain delay time. In FIG. 3, the relation between the period 201a and the corresponding triggered period 201b is illustrated by the arrow C. Similarly, the period 202a of the waveform 12a triggers the period 202b of the waveform 14a, and the period 203a of the first clock 12 triggers the period 203b of the second clock 14, etc.

After the delayer 16 generates the period 201b of the second clock 14 according to the trigger of the period 201a, the comparator 24 compares the lead/lag relation between the first clock 12 and the second clock 14. After comparing, the comparator 24 generates the comparison signal according to the relative relation between the period 201b and the period 202a. In other words, when comparing the second clock 14 with the first clock 12, the comparator 24 uses the period 202a which lags behind the period 201a by one period (1T) as a reference period to compare with the period 201b of the second clock 14. Then, the comparator 24 determines whether the second clock 14 is synchronized with the first clock 12. Taking FIG. 3 for example, the comparator 24 judges that the first clock 12 leads the second clock 14 because the period 201b of the first clock 12 lags behind the period 202a of the first clock 12. As mentioned above, the delayer 16 generates the period 201b of the second clock 14 according to the trigger of the period 201a of the first clock 12. There is a critical delay between the period 201a and the period 201b because of the unknown system delay and the initial value of the delay time of the delayer 16, and it is impossible for the period 201b to be synchronized with the period 202a in the beginning. As shown in FIG. 3, there is an interval (indicated by the arrow 15a)of 25 dt between respective rising edges of the period 202a and the period 201b. Please note that the comparator 24 only indicates the lead/lag relation between the period 202a and the period 201b. The comparator 24 does not measure the delay time, that is, the interval between respective rising edges of two periods.

After comparing the period 202a with the period 201b, the comparator 24 judges that the second clock 14 lags behind the first clock 12. The controller 22, therefore, controls the delayer 16 to activate one delay unit 18 less for decreasing the delay time by 1 dt (Step 30). When the delayer 16 starts generating the corresponding period 202b by the trigger of the rising edge of the period 202a, the delay time between the period 202a and the period 202b decreases by 1 dt because one delay unit 18 less is used. Similarly, the interval between the period 202b and the reference period 203a decreases by 1 dt to 24 dt(as shown in FIG. 3). Certainly, the comparator 24 compares the period 203a with the period 202b again (Step 28). If the first clock 12 still leads the second clock 14, the controller 24 controls the delayer 16 to active one delay unit 18 less again (Step 30). Then, the delayer 16 generates the period 203b by the trigger of the period 203a of the first clock 12. The interval between the two periods 203a and 203b decreases by 1 dt again because of one delay unit 18 less being used. Therefore, the interval between the rising edges of the reference period 204a and the period 203b decreases by 1 dt to 23 dt.

With the comparison and adjustment of the known delay lock loop circuit 10, the interval between the reference period and the period of the second clock 14 continuously decreases by increments of 1 dt. The prior art delay lock loop circuit 10 repeatedly uses a fixed interval (1 dt) for adjusting each period of the second clock 14. As shown in FIG. 3, when the delayer 16 uses the trigger of the period 210a to generate the corresponding period 210b, the interval between respective rising edges of the period 210b and the reference period 211a decreases to 16 dt (please refer to waveforms 12b and 14b). When the time reaches 20T (please refer to waveforms 12c and 14c), the interval between period 220b and the corresponding reference period 221a has decreased to 6 dt. When the time reaches 26T, the interval between the period 226b and the corresponding reference period 226a exactly equals one period (1T) of the first clock 12. Meanwhile, the period 226b of the second clock is synchronized with the period 227a. After repeatedly adjusting, the delayer 12 activates a reasonable amount of delay units 18 to make the interval between respective rising edges of the period of the first clock 12 and the triggered period of the second clock 14 equal one period (1T) of the first clock 12. As mentioned above, the delayer 16 uses the rising edge of the first clock 12 to trigger the corresponding rising edge of the second clock 14, but there is a delay time because of the unknown system delay and different amounts of delay units 18 activated by the delayer 16. In the beginning, the delayer 16 does not obtain the exact value of system delay. Similarly, the amount of delay units used is an uncertain value. The first clock, therefore, is not synchronized with the second clock. In the following correcting process, the delay lock loop circuit 10 repeats Step 28 and Step 30 (or Step 32) to continuously adjust the delay time between the first clock and the second clock. The delay time generated from the delay units 18 activated by the delayer 16 and the unknown system delay exactly equals one period of the first clock. Now the delayer 16 generates the second clock from the trigger of the first clock, and then the second clock is synchronized with the first clock. The delay lock loop circuit 10 repeatedly performs the correcting process to correct the errors generated from the system disturbance. But, the delayer 16 only increases or decreases one or two delay units activated for slightly correcting the disturbance generated from the system.

The disadvantage of the prior art technique is that it spends a longer time on synchronizing the second clock with the first clock because the known technique adjusts by one unit time (1 dt) each cycle. In order to increase the accuracy for the second clock to lock the first clock, the unit of delay time must be short enough to prevent quantization errors. Taking FIG. 3 for example, if the delay time between the period of the first clock and the corresponding period of the second clock is 0.5 dt, the second clock can not be synchronized with the first clock however the delay lock loop circuit adjusts. Because the delay lock loop circuit uses the unit of delay time (dt) as the minimum unit to correct the delay time of the second clock, the interval less than one unit of delay time becomes a quantization error. It is impossible to correct such a quantization error. In other words, the length of the unit delay time can be used to measure the quantization error.

In order to decrease the quantization errors, when designing the digital delay lock loop circuit such as the delay lock loop circuit 10, it is necessary to reduce the unit of delay time (dt) as much as possible. For example, if one period T of the first clock in FIG. 3 equals 100 dt (1 dt=T/100), the quantization error which makes the first clock unable to be synchronized with the second clock is less than 0.01T. If the unit of delay time dt reduces to 0.001T, the quantization error is less than 0.001T. The smaller the unit of delay time, the more cycles needed to adjust the delay time of the second clock. As shown in FIG. 3, the known technique only adjusts (increases or decreases) one unit time each period T when adjusting the delay time of the second clock. The smaller the unit of delay time is, the smaller amount of adjustment is applied in one period T. On the contrary, it spends a long time on completing the whole correcting process. In other words, it needs more periods T to adjust the second clock for being synchronized with the first clock. Of course, a delay lock loop circuit must not only provide a small quantization error, but must also quickly synchronize the first clock with the second clock.

SUMMARY OF INVENTION

It is therefore an objective of the claimed invention to provide a method of performing a delay lock that improves both speed and accuracy.

Briefly, the claimed invention provides a method of performing a delay lock to generate a second clock according to a first clock, and to synchronize the second clock with the first clock. The method has a plurality of correcting processes executed to increase or decrease, by a correction interval, a delay time between corresponding periods of the first clock and the second clock. The correction interval for a subsequent correcting process is substantially half the correction interval of the previous correcting process.

It is an advantage of the present invention that the method for performing a delay lock, and related circuits, speed up a correcting process without increasing a quantization error.

These and other objectives and advantages of the present invention will no doubt become obvious to those of ordinary skill in the art after having read the following detailed description of the preferred embodiment that is illustrated in the various figures and drawings.

DETAILED DESCRIPTION

Figure 4:
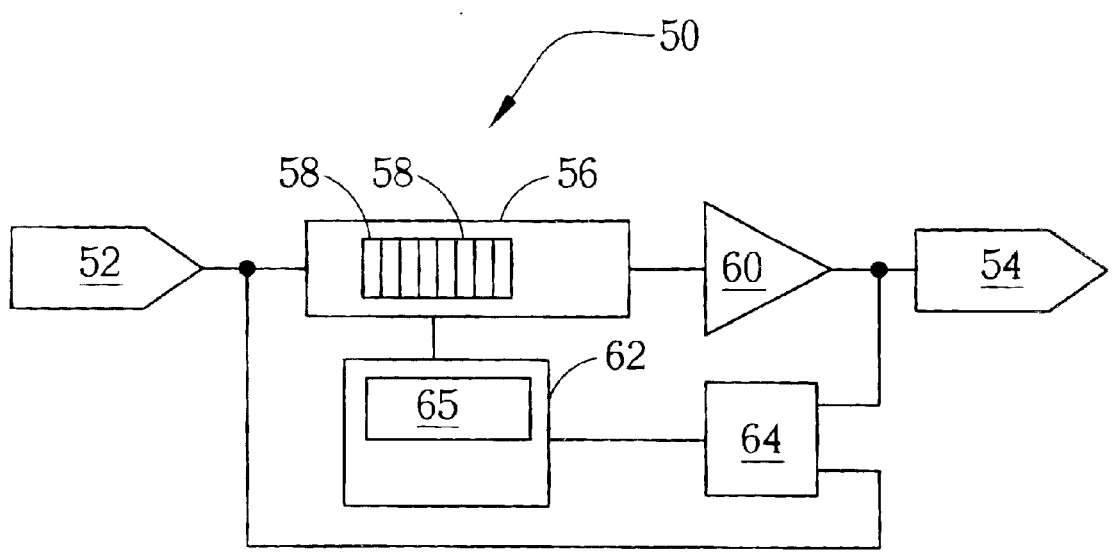
FIG. 4 is a function block of a delay lock loop circuit according to the present invention.

Please refer to FIG. 4, which is a function block diagram of the delay lock loop circuit according to the present invention. The delay lock loop circuit 50 comprises a delayer 56, a buffer 60 electronically connected to the delayer 56, a comparator 64, and a controller 62. The delayer 56 comprises a plurality of delay units 58, and each delay unit 58 can delay one unit of delay time (dt). The controller 62 has a register 65. The present invention is similar to the known delay lock circuit 10, and the delay lock circuit 50 likewise uses the delayer 56 to generate the second clock 56 according to the first clock 52. The buffer 60 increases the current capacity of the second clock 56 and then outputs the second clock 56. In order to synchronize the second clock 54 with the first clock 52, both clocks are fed back to the comparator 64 for determining whether the two clocks are synchronized or not. According to the comparison result, the comparator 64 generates a corresponding comparison signal to the controller 62. With the comparison result, the controller 62 adjusts the delayer 56 for synchronizing the second clock 54 generated from the delayer 56 with the first clock 52.

As discussed above, when the delay lock circuit starts operating, the second clock generated from the delayer is not capable of being synchronized with the first clock. The prior art delay lock circuit repeatedly corrects the delay time of the second clock by one unit each period. In order to reduce the time spent on the correcting process, the delay lock circuit of the present invention first starts a process of initializing the delay lock when synchronizing the second clock with the first clock. Please refer to FIG. 5, which is a flow chart of the process of initializing the delay lock. There are the following steps for initializing the delay lock.

STEP 66: The process of initializing the delay lock begins. When the delay lock circuit 50 starts operating, the second clock 54 generated from the delayer 56 according to the first clock 52 is not synchronized with the first clock 52. It is time to start the process of initializing the delay lock.

STEP 68: Set one correcting interval Dt as a predetermined initial value. Then, the correcting process 71 begins.

The following steps occur in the correcting process 71.

STEP 70: According to the trigger of one period of the first clock, the delayer 56 generates a corresponding period of the second clock after a certain delay time. The comparator 65 determines the lead/lag relation between the first clock 52 and the second clock 54. The delay time comprises the unknown system delay and the delay time generated from the delay units activated by the delayer 56. According to the comparison result, if the first clock leads the second clock, go to Step 72A; else, go to Step 72B.

STEP 72A: Reduce the delay time of the second clock by a correcting interval Dt. In other words, when the delayer 56 generates the period of the second clock according to the first clock, the delayer 56 activates a smaller amount of delay units 58 to reduce the delay time between the period of the first clock and the corresponding period of the second clock by a correcting interval Dt. Each delay unit 58 can increase the delay time by one unit of delay time dt. In order to reduce the delay time by a correcting interval Dt, the number of reduced delay units which are not activated is Dt/dt.

STEP 72B: Step 72B is contrary to the objective of Step 72A. This step is to increase the delay time of the second clock by a correcting interval Dt. In other words, when the delayer 56 generates the period of the second clock according to the first clock, the delayer 56 activates a larger amount of delay units 58 to increase the delay time between the period of the first clock and the corresponding period of the second clock by a correcting interval Dt. In order to increase the delay time by a correcting interval Dt, the number of added delay units that are activated is Dt/dt.

STEP 74: Modify the value of the correcting interval Dt to be half of the previous correcting interval.

The related information (for example, the length of the correcting interval, or the number of modifications of the correcting interval) about the correcting interval is updated and stored into the register 65 of the controller 62.

STEP 76: Finally, use one condition to decide whether to terminate the correcting process or not. One embodiment of such a condition is to check the length of the correcting interval Dt. Because the correcting interval Dt reduces with the recursive correcting processes, the condition is satisfied when the correcting interval Dt is reduced to a predetermined value. Checking the information about the correcting interval Dt stored in the register 65 can be used as a condition, too. If the number of modifications of the correcting interval Dt exceeds a predetermined value, the condition is satisfied and the process is terminated. Whatever the condition is, if the condition is satisfied, go to Step 78 (terminate the process of initializing the delay lock). On the contrary, if the condition is not satisfied, return to Step 70 and start the correcting process 71 again.

STEP 78: After the condition is satisfied, the correcting process 71 is terminated. The entire process of initializing the delay lock is over.

Figure 6:
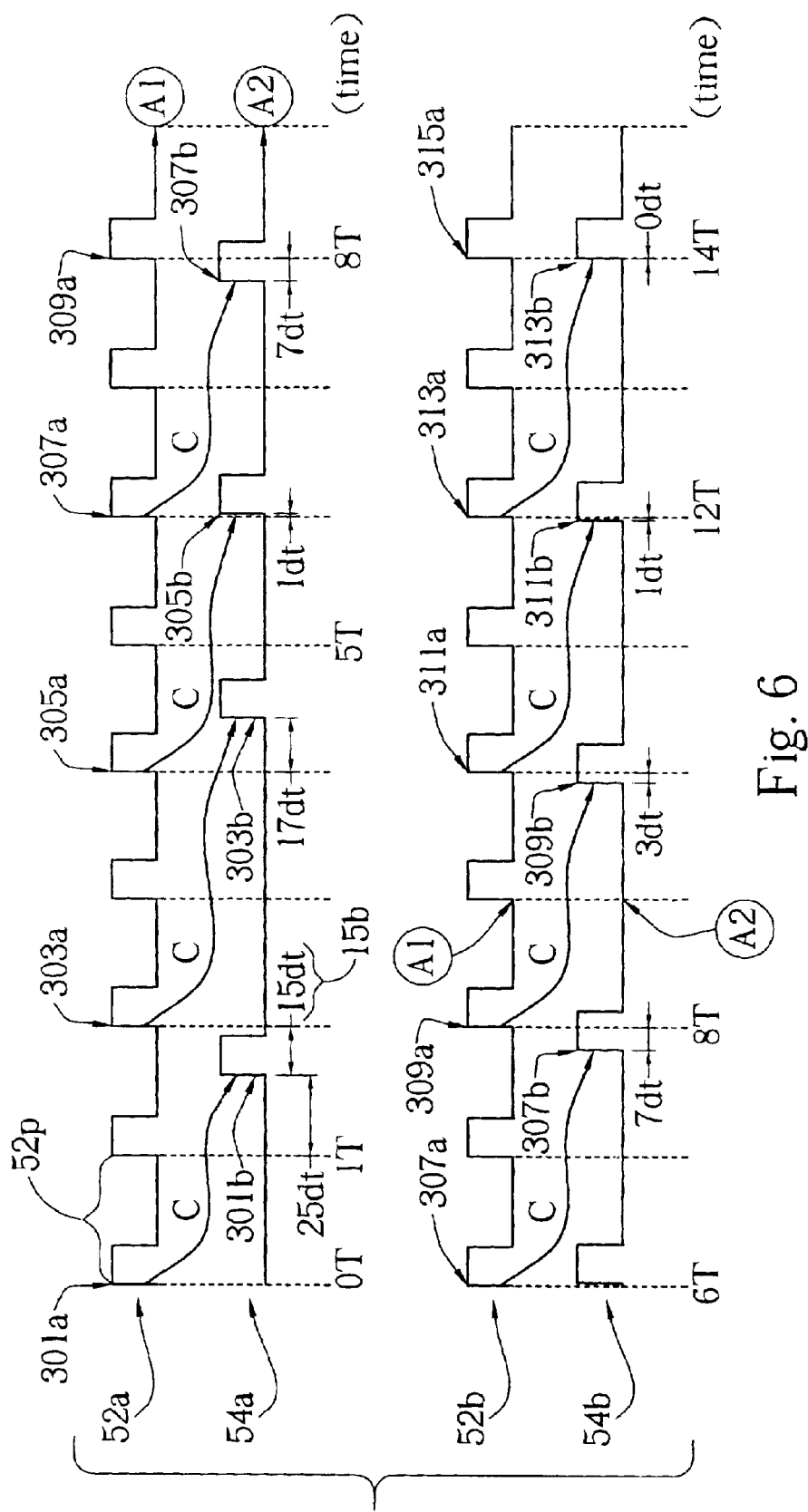
FIG. 6 is a sequential waveform plot of a first clock and a second clock in the delay lock loop circuit mentioned in FIG. 4.

In order to further explain the process of initializing the delay lock, please refer to FIG. 6. FIG. 6 is a sequential waveform plot of the first clock 52 and the second clock 54 in the process of initializing the delay lock according to the present invention. In FIG. 6, the horizontal axis represents the time, and the perpendicular axis represents the magnitude of the wave. The waveforms of the first and second clocks are divided into two parts for better illustration. The wave 52a is the waveform of the first clock 52 between time 0T and time 9T. The wave 52b is the waveform of the first clock 52 between time 6T and time 15T. Please note that the wave 52b overlaps part of the wave 52a for disclosing the technique completely. Combining the wave 52a with the wave 52b at the point A1 forms the complete waveform of the first clock 52 from time 0T to time 15T. As the prior art does, the present invention similarly generates the second clock by the triggers of the first clock. The first clock 52 has a fixed period T as indicated by the interval 52p. The controller 62 drives the delayer 56 to modify the delay time of the second clock 54. Consequently, the period of the second clock 54 varies.

Figure 1:
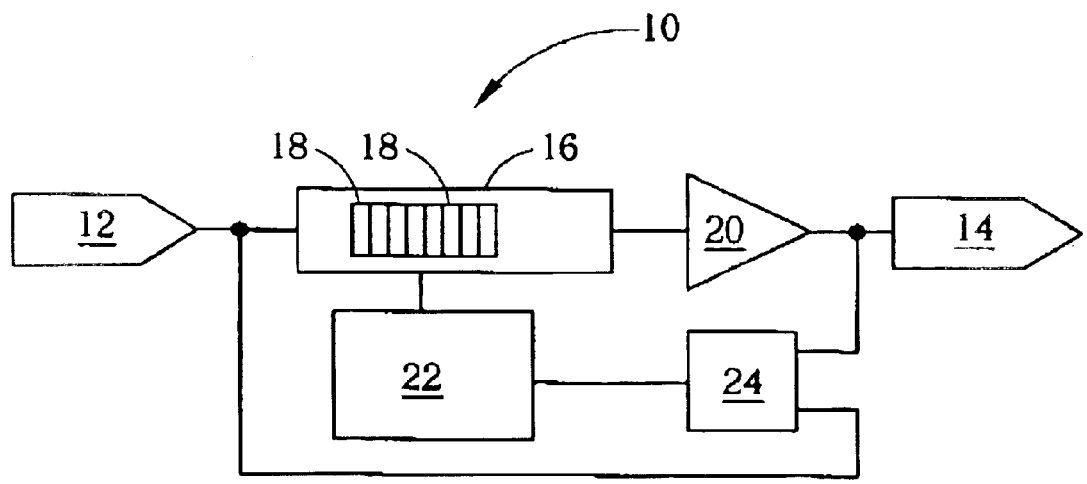
FIG. 1 is a function block diagram of a prior art delay lock loop circuit.
Figure 2:
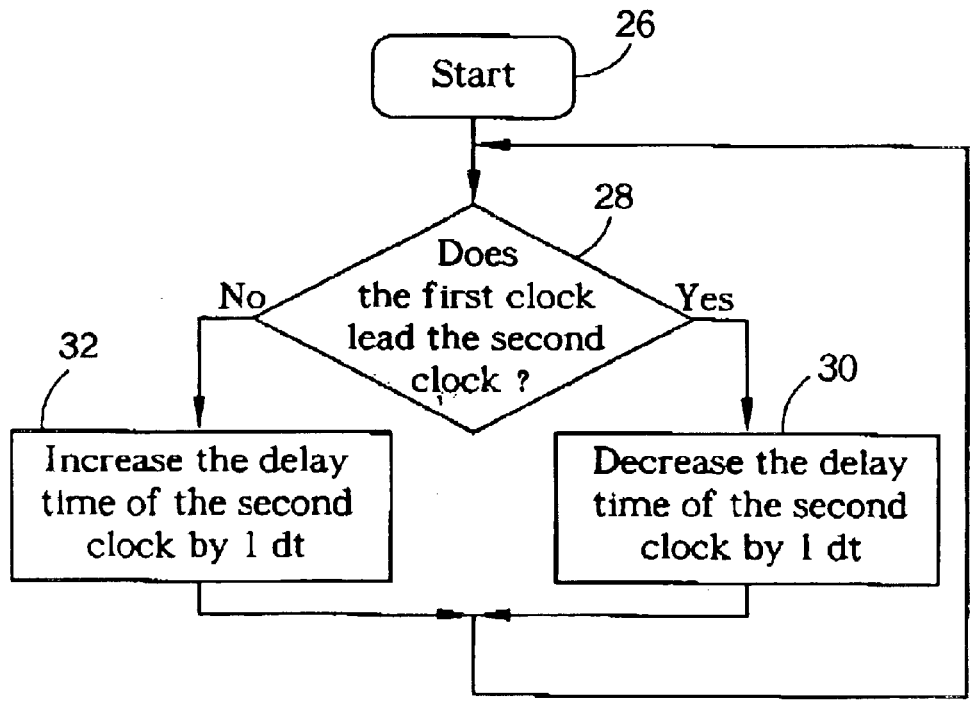
FIG. 2 is a flow chart of a method used in the known delay lock loop circuit mentioned in FIG. 1.
Figure 3:
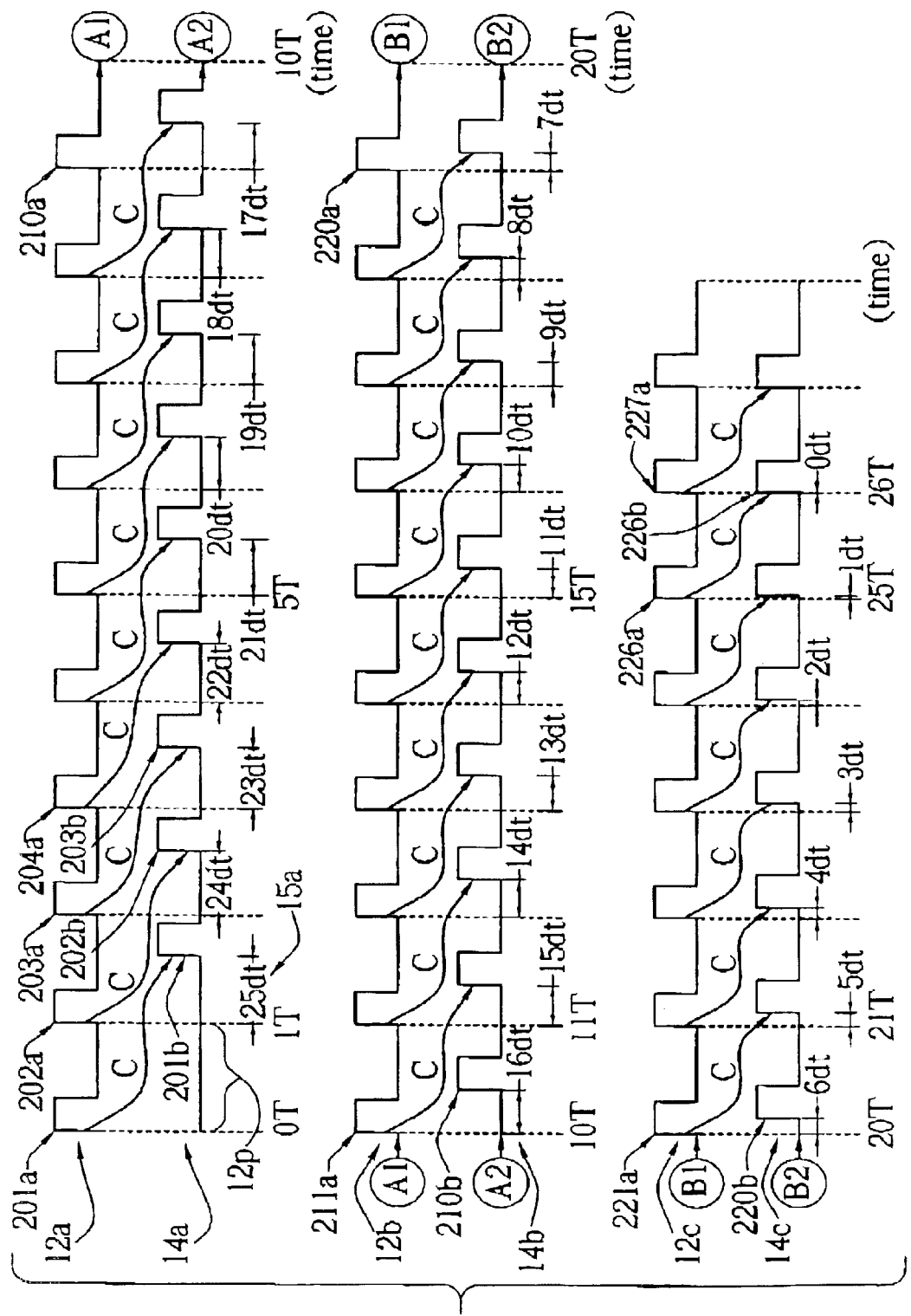
FIG. 3 is a sequential waveform plot of a first clock and a second clock in the delay lock loop circuit mentioned in FIG. 1.

When the delay lock circuit 50 starts operating, the delayer 56 uses the trigger of the rising edge of the period 301a to generate a corresponding period 301b after delaying for a certain time. In FIG. 6, the relative relation between the periods 301a and 301b is indicated by arrow C. As mentioned regarding the related prior art, the interval between respective rising edges of the periods 301a and 301b, that is, the delay time of the second clock, is generated from the unknown system delay and the initial amount of delay units 58 activated by the delayer 56. Please note that the delay time between period 301a and period 301b is identical to the delay time between period 201a and period 201b, so as to compare fairly with the correcting process of the prior art. In other words, the respective initial conditions in FIG. 3 and FIG. 6 are the same. The unit of delay time (dt) of each delay unit 58 in FIG. 6 is identical to the unit of delay time in FIG. 3. The period T of the first clock in FIG. 6 is identical to the period T of the first clock 12, too.

After the process of initializing the delay lock begins, the initial value of the correcting interval Dt equals 32 dt (dt is one unit of delay time of a delay unit 58). When determining the lead/lag relation between the first clock and the second clock, the comparator 64 uses the period 303a lagging behind the period 301a by two periods as a reference period to compare with the period 301b of the second clock 54(Step 70 in FIG. 5). As shown in FIG. 6, the period 301b leads the reference period 303a by an interval of 15 dt. The comparator 64 consequently judges that the second clock leads the first clock, and transmits a corresponding signal to the controller 62. The period 303a which lags behind the period 301a by two periods is used as a reference period because of waiting for the state of the period 301b to be stable. It is identical to the prior art, in that the comparator 64 only determines the lead/lag relation between the period of the second clock and the reference period of the first clock. The comparator 64 does not exactly determine the quantity of the delay time.

After the controller 62 receives the comparison signal from the comparator 64, the controller 62 controls the delayer 56 to activate 32 delay units more for increasing the delay time to 32 dt (length of the correcting interval) on the next period of the triggered second clock. Then, the length of the correcting interval is reduced to half the original interval, and the related information of the correcting interval Dt stored in the register 65 is updated (Step 72B, Step 74). In the present embodiment, the condition for terminating the process is the length of the correcting interval being smaller than 1 dt. Then, the correcting process returns to Step 70.

In the following procedure, the delayer 56 uses the period 303a of the first clock 52 triggered to generate the corresponding period 303b of the second clock 54. As mentioned above, the delayer 56 adds the delay time 32 dt to the period of the second clock. With the addition of the delay time 32 dt, the period of the second clock which formerly led the reference period by 15 dt lags behind the reference period 305a by 17 dt. As shown in FIG. 6, the period 303b lags behind the reference period 305a by 17 dt. After comparing the reference period 305a and the period 303b, the comparator 64 judges that the second clock 54 lags behind the first clock 52.

Figure 5:
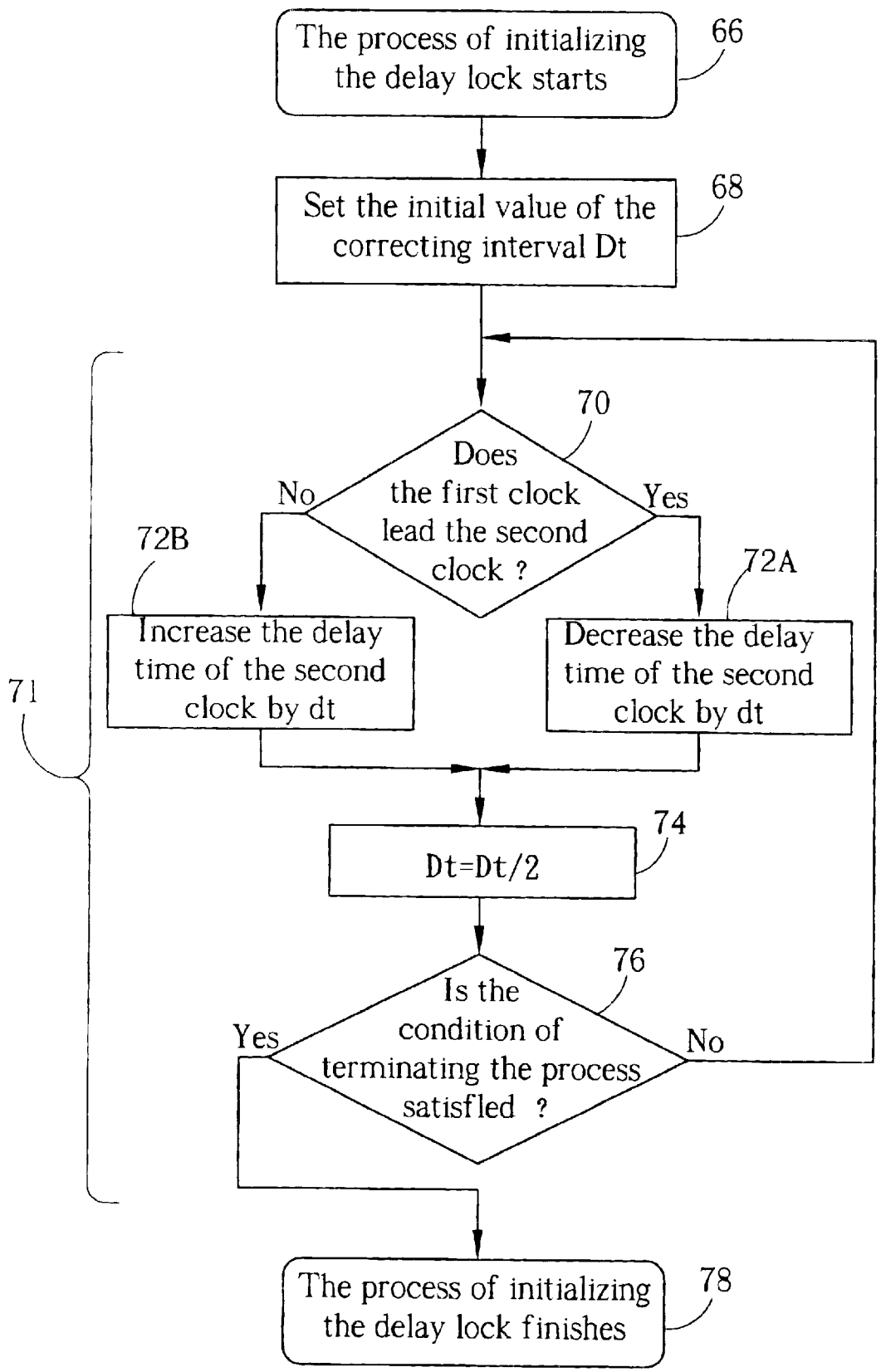
FIG. 5 is a flow chart of a method used in the delay lock loop circuit mentioned in FIG. 4.

As shown in FIG. 5, when the delayer 56 uses the period 305a of the first clock 52 to generate a corresponding period 305b, the delayer 56 activates 16 delay units 58 less than before to reduce the delay time by one correcting interval Dt, that is, 16 dt for the corresponding period of the second clock 54. Please note that the correcting interval Dt is half the correcting interval of the previous correcting process. As compared with the correcting interval of the previous correcting process, the correcting interval Dt has become 16 dt. After subtracting 16 dt from the delay time, the previous delay time, that is, 17 dt between the period of the second clock and the reference period becomes 1 dt. As shown in FIG. 6, the delay time between the period 305b and the reference period 307a is 1 dt.

When the delayer 56 uses the trigger of the period 307a to generate the corresponding period 307b of the second clock 54, the period 307b leads the reference period 309a by 7 dt because of subtracting 8 dt from the delay time. The delay time has shortened by one correcting interval (8 dt).

The correcting process 71 proceeds again. When the delayer 56 uses the trigger of the period 309a to generate the corresponding period 309b (refer to waveforms 52b and 54b), the delay time between the period 309b and the reference period 309a becomes 3 dt because of adding 4 dt (one correcting interval) to the previous delay time. Similarly, the delay time between the period 311b and the reference period 311a becomes 1 dt, because of adding 2 dt (one correcting interval) to the previous delay time. Finally, the delay time between the period 313b and the reference period 313a becomes 0 dt because of adding 1 dt (one correcting interval) to the previous delay time, and the second clock 54 is synchronized with the first clock 52. Please note that the correcting process and the whole process of initializing the delay lock are terminated because the following correcting interval is less than 1 dt.

After the process of initializing the delay lock is finished, the delay time generated from the delay units 58 activated by the delayer 56 plus the system delay totally equals an integral multiple of the period T (2T in FIG. 6). Then, the delay lock circuit 50 according to the present invention repeatedly uses each rising edge of the periods of the first clock 52 to generate the corresponding periods of the second clock 54. Please note that the delay lock circuit 50 triggers one period of the second clock 54 every two periods. Because the delay time has been adjusted to be an integral multiple of the period T, the second clock 54 is synchronized with the first clock 52. The comparator 64, of course, continues working to make the controller 62 capable of correcting the delay error generated from the system. The delay error generated from the system usually only requires very slight correction.

Figure 7:
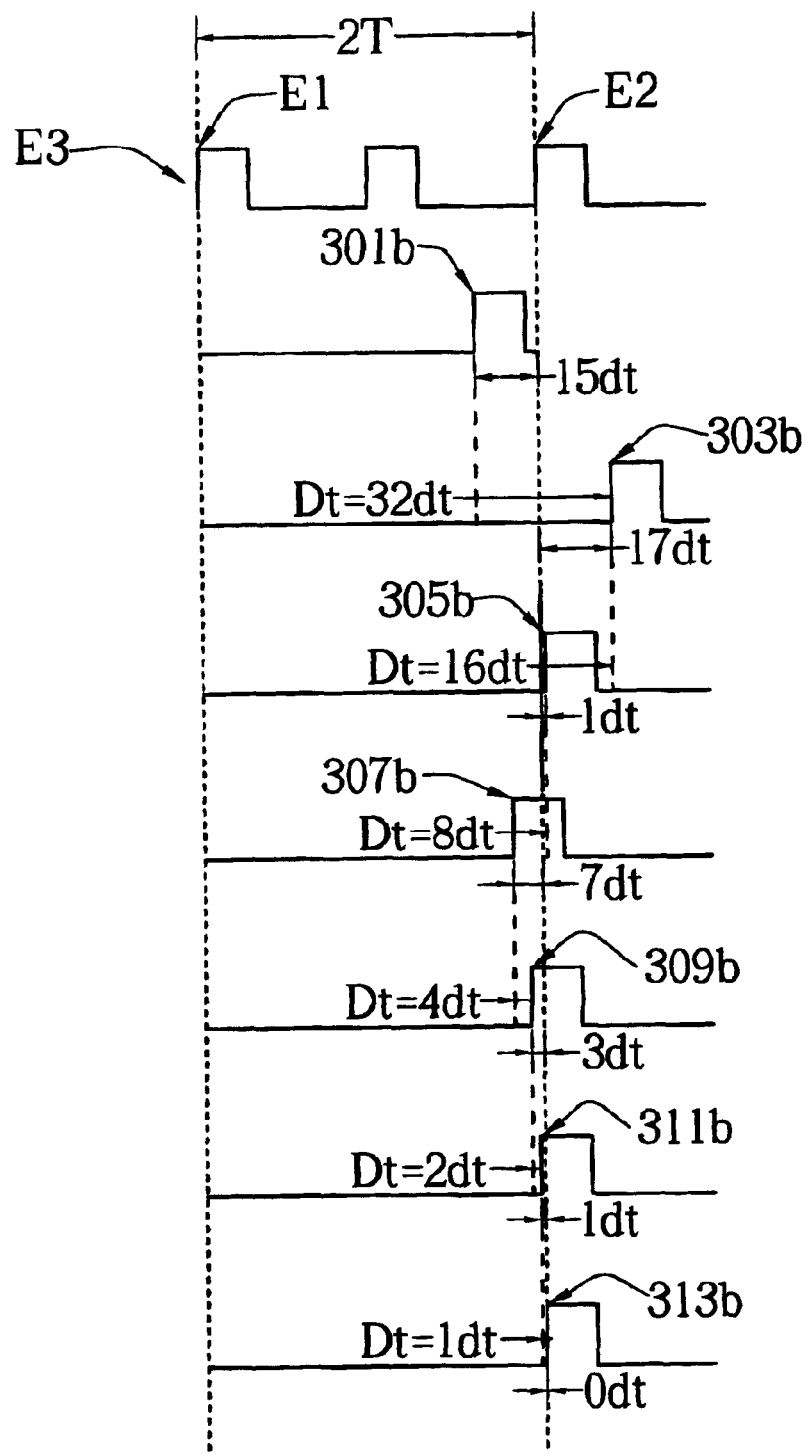
FIG. 7 is a diagram of a method of correcting delay time according to the present invention.

Please further refer to FIG. 7 for summing up the correcting process of initializing the delay lock. FIG. 7 is a diagram of the correcting process when the delay time is corrected by each period of the second clock 54. In FIG. 7, the horizontal axis represents time. The respective waveforms from top to bottom are each period of the second clock 54 (periods 301b, 303b, 305b, 307b, 309b, 311b, and 313b). The period E1 represents the period which is triggered to generate each period mentioned above. The period E2 represents the corresponding reference period according to each period mentioned above. The waveform E3 represents three periods of the first clock 52. In other words, the period E1 represents the period 301a, and the period E2 represents the reference period 303a according to the period 301b. Similarly, the rising edge of the period E1 represents the rising edge of the period 303a, and the rising edge of the period E2 represents the rising edge of the reference period 305a according to the period 303b. Finally, the period E1 represents the period 313a which triggers the period 313b, and the period E2 represents the reference period 315a. As shown in FIG. 7, it is clear that the correcting interval Dt is gradually reduced with repetition of the correcting process, and finally the second clock is synchronized with the first clock.

The process of initializing the phase lock according to the present invention updates the value of the correcting interval. The delay lock circuit 50 according to the present invention uses a register 65 to store the related information of the correcting interval, and the information of the correcting interval is used to determine whether the correcting process should be terminated. The present invention uses the bisection algorithm to gradually reduce the correcting interval, that is, to make the correcting interval half the previous correcting interval. Therefore, the related information of the correcting interval is stored by binary bits. Taking FIG. 6 for example, the correcting interval Dt (32 dt) can be stored in the register 65 by 5 bits (00000). After the correcting interval Dt becomes 16 dt the information stored in the register 65 can be represented by 10000. After the correcting interval Dt becomes 8 dt, the information stored in the register 65 can be represented by 11000. After the correcting interval Dt becomes 4 dt, the information stored in the register 65 can be represented by 11100. After the correcting interval Dt becomes 2 dt, the information stored in the register 65 can be represented by 11110. After the correcting interval Dt finally becomes 1 dt, the information stored in the register 65 can be represented by 11111. At this point, the correcting process is ready to be terminated. With the simple method mentioned above, we can use the register 65 to control the process of initializing the phase lock.

As compared with the correcting process in FIG. 3, the present invention which uses the process of initializing the delay lock to lock the delay time operates faster than the prior art under the same conditions (the same initial state, the same unit of delay time dt, and the same period T). The prior art needs 26 periods (26T) to synchronize the first clock with the second clock, but the present invention only spends 14T to do so. This is because the present invention uses a larger correcting interval to adjust the delay time in the beginning of the process of initializing the phase lock, and gradually reduces the correcting interval to perform a detailed correction. Doing so not only reduces the time required for the process of initializing the phase lock, but also does not increase the quantization error. As discussed before, each correction of the delay time is the same (1 dt) according to the prior art. In order to speed up the process of delay locking, it is necessary to increase the unit of the delay time. Consequently, the quantization error is increased. On the contrary, the present invention makes the correcting interval to be half of the previous correcting interval by a bisection algorithm. The present invention not only reduces the time required for the process of initializing the phase lock, but also does not increase the quantization error.

The advantage of the present invention is obviously revealed by comparing the present invention with the prior art in a quantitative viewpoint. Suppose that one unit of the delay time is T/1024(1 dt=T/1024). The prior art needs 512 periods to correct the delay time of the second clock for synchronizing the second clock with the first clock. On the contrary, the present invention applies the bisection algorithm to gradually adjust the delay time, and only needs about 10 ($\log_2[1024]$) periods to synchronize the second clock with the first clock in the process of initializing the phase lock. Suppose that one unit of the delay time is T/2048 (1 dt=T/2048). The prior art needs 1024 periods to correct the delay time of the second clock for synchronizing the second clock with the first clock. Under the same circumstances, the present invention, which applies the bisection algorithm, only needs 11 ($\log_2 [2048]$) periods to finish the process of initializing the phase lock, and does not increase the quantization error. To sum up, the present invention can speed up the process of delay lock without increasing the quantization error. The present invention not only makes the delay lock circuit operate more precisely, but also reduces the time spent on the recursive correcting process. The efficiency is greatly improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A delay lock circuit for generating a second clock according to a first clock and synchronizing the first clock and the second clock, the delay lock circuit comprising:

a comparator for determining if corresponding periods of the first clock
and the second clock are synchronized and generating a
corresponding comparison signal;

a delayer electrically connected to the comparator for delaying the first
clock so as to change a delay time between the corresponding
periods of the first clock and the second clock; and a controller to control the delay lock circuit;

wherein the controller uses the delayer to perform a correcting process to increase or decrease the delay time between the corresponding periods of the first clock and the second clock by a correction interval, wherein a subsequent correction interval of a subsequent correcting process is less than a previous correction interval of a previous correcting process, and the controller terminates the correcting process if the correction interval is smaller than a predetermined value.

2. The delay lock circuit of claim 1, wherein the delayer comprises a plurality of delay units, each of the delay units capable of increasing the delay time between the corresponding periods of the first clock and the second clock by a unit delay time.

3. The delay lock circuit of claim 1, wherein the delay lock circuit further comprises a register to store information about the correction interval.

4. The delay lock circuit of claim 1, wherein the comparator compares the time interval between a period of the second clock and a corresponding reference period of the first clock to generate the comparison signal, wherein the period of the first clock corresponding to the period of the second clock leads the reference clock by a predetermined reference interval.

5. A method for performing a delay lock to generate a second clock according to a first clock and to synchronize the second clock with the first clock, the method comprising:
    executing a plurality of correcting processes, each of which increases or decreases by a respective correction interval a respective delay time between corresponding periods of the first clock and the second clock; and
    terminating the plurality of correcting processes when the correction interval is smaller than a predetermined value;
    wherein a subsequent correction interval for a subsequent correcting process is less than a previous correction interval of a previous correcting process.

6. The method of claim 5, wherein the correcting process further comprises:
    determining if the first clock and the second clock are synchronized and generating a corresponding comparison result;
    wherein the delay time between the corresponding periods of the first clock and the second clock for the subsequent correcting process is increased or decreased by the subsequent correction interval according to the comparison result.

7. The method of claim 6, wherein determining if the corresponding periods of the first clock and the second clock are synchronized is decided by comparing the time interval between a period of the second clock and a corresponding reference period of the first clock.

8. The method of claim 6 further comprising:
    prior to the plurality of correcting processes, setting the correction interval to a predetermined initial value.

9. The method of claim 6, wherein the method is used for a delay lock circuit, the delay lock circuit comprising:
    a delayer for delaying the first clock in order to change the delay time between the corresponding periods of the second clock and the first clock;
    wherein when the delay time between the corresponding periods of the first clock and the second clock is increased or decreased by the correction interval, the delayer is used to delay the second clock so that the delay time between the corresponding periods of the first clock and the second clock is modified.

10. The method of claim 9, wherein the delayer comprises a plurality of delay units, each of the delay units capable of increasing the delay time between the corresponding periods of the first clock and the second clock by a unit delay time.

11. The method of claim 9, wherein the delay lock circuit further comprises a comparator electrically connected to the delayer for determining if the corresponding periods of the first clock and the second clock are synchronized and generating a corresponding comparison result; wherein the delay time between the corresponding periods of the first clock and the second clock is increased or decreased by the correction interval according to the comparison result.

12. The method of claim 11, wherein the comparator compares the time interval between a period of the first clock and a corresponding reference period of the second clock to generate the comparison result; wherein the period of the first clock corresponding to the period of the second period leads the reference period by a predetermined reference interval.

13. The method of claim 9, wherein the delay lock circuit further comprises a register to store information about the correction interval.

* * * * *